United States Patent [19]
Dumoulin

[11] Patent Number: 5,233,298
[45] Date of Patent: Aug. 3, 1993

[54] QUANTITATIVE MEASUREMENT OF BLOOD FLOW AT MULTIPLE POSITIONS USING COMB EXCITATION AND FOURIER VELOCITY ENCODING

[75] Inventor: Charles L. Dumoulin, Ballston Lake, N.Y.

[73] Assignee: General Electric Company, Schenectady, N.Y.

[21] Appl. No.: 838,653

[22] Filed: Feb. 20, 1992

[51] Int. Cl.⁵ .............................................. G01R 33/20
[52] U.S. Cl. ................... 324/306; 128/653.3
[58] Field of Search .............. 324/300, 307, 309, 306, 324/318, 322; 128/653.3

[56] References Cited

U.S. PATENT DOCUMENTS

| | | | |
|---|---|---|---|
| 4,431,968 | 2/1984 | Edelstein et al. | 324/309 |
| 4,706,024 | 11/1987 | Dumoulin | 324/309 |
| 4,796,635 | 1/1989 | Dumoulin | 128/653 |
| 5,133,357 | 7/1992 | Dumoulin et al. | 128/653.3 |

OTHER PUBLICATIONS

C. L. Dumoulin, H. E. Cline, S. P. Souza, et al in "Three Dimensional Time-of-Flight Magnetic Resonance Angiography Using Spin Saturation", Magn. Reson. Med., 11:35, 1989.

C. L. Dumoulin, S. P. Souza, M. F. Walker, et al in "Three Dimensional Phase Contrast Angiography", Magn. Reson. Med. 9:139, 1989.

"Quantitative Measurement of Blood Flow Using Cylindrically Localized Fourier Velocity Encoding" was disclosed by Dumoulin et al in U.S. patent application Ser. No. 07/651,872 filed on Feb. 7, 1991.

D. A. Feinberg, L. E. Crooks, P. Sheldon et al "Magnetic Resonance Imaging the Velocity Vector Components of Fluid Flow" in Mag. Reson. Med 2:555, 1985.

S. P. Souza, J. Szumowski, C. L. Dumoulin et al, "SIMA: Simultaneous Multislice Acquisition of MR Images by Hadamard-Encoded Excitation", in J. Comp. Asst. Tomogr. 12:1026, 1988.

G. H. Glover, "Phase-Offset Multiplanar (POMP) Volume Imaging: A New Technique", in J. Magn. Reson. Imag. 1:457, 1991.

C. L. Dumoulin, S. P. Souza, M. F. Walker and E. Yoshitome, "Time-Resolved Magnetic Resonance Angiography", Mag. Reson. Med. 6:275, 1988.

Primary Examiner—Michael J. Tokar
Attorney, Agent, or Firm—Lawrence P. Zale; Paul R. Webb, II

[57] ABSTRACT

A method of imaging and quantitatively measuring blood velocity distribution within a selected vessel employs Nuclear Magnetic Resonance excitation of a number of regions of a subject to be imaged by an rf excitation pulse applied in a magnetic field gradient. The rf excitation pulse has several frequency bands with the frequencies between the bands having essentially no amplitude. A frequency band causes excitation of a region of the subject. Each frequency band is encoded with a unique phase angle offset so that the signals from each region may be separated. The excited regions are Fourier velocity encoded along a second axis based upon their flow velocities. A re-radiated signal is acquired in the presence of a readout gradient to provide resolution along a selected axis and reconstruct a velocity profile. This method can be combined with cardiac synchronization to measure flow dynamics or it can be applied without synchronization to measure steady flow. The geometry of the measurement is flexible in that the directions of flow sensitivity and geometric resolution are independent.

14 Claims, 16 Drawing Sheets

| No. of Slabs | Phase angle (Deg.) Offset for each Slab No. | | | | | | | | | | |
|---|---|---|---|---|---|---|---|---|---|---|---|
| 1 | 0 | | | | | | | | | | |
| 2 | -90 | 90 | | | | | | | | | |
| 3 | -120 | 0 | 120 | | | | | | | | |
| 4 | -120 | -40 | 40 | 120 | | | | | | | |
| 5 | -120 | -60 | 0 | 60 | 120 | | | | | | |
| 6 | -120 | -72 | -24 | 24 | 72 | 120 | | | | | |
| 7 | -120 | -80 | -40 | 0 | 40 | 80 | 120 | | | | |
| 8 | -126 | -90 | -54 | -18 | 18 | 54 | 90 | 126 | | | |
| 9 | -120 | -90 | -60 | -30 | 0 | 30 | 60 | 90 | 120 | | |
| 10 | -135 | -105 | -75 | -45 | -15 | 15 | 45 | 75 | 105 | 135 | |
| 11 | -120 | -96 | -72 | -48 | -24 | 0 | 24 | 48 | 72 | 96 | 120 |

*FIG. 10*

QUANTITATIVE MEASUREMENT OF BLOOD FLOW AT MULTIPLE POSITIONS USING COMB EXCITATION AND FOURIER VELOCITY ENCODING

BACKGROUND OF THE INVENTION

1. Field of the Invention

This invention relates to quantitative measurement of blood flow, and more specifically, quantitative measurement of blood flow using Magnetic Resonance Imaging.

2. Description of Related Art

Imaging of fluid flow within a subject by Magnetic Resonance (MR), has been demonstrated using a variety of techniques based on time-of-flight phenomena and the phenomena of velocity-induced phase shifts. Most of these techniques have been applied to angiography, or the imaging of vascular systems. Techniques for angiography are described by C. L. Dumoulin, H. E. Cline, S. P. Souza, et al. in "Three Dimensional Time-of-Flight Magnetic Resonance Angiography Using Spin Saturation", Magn. Reson. Med., 11:35, 1989, and C. L. Dumoulin, S. P. Souza, M. F. Walker, et al. in "Three Dimensional Phase Contrast Angiography", Magn. Reson. Med., 9:139, 1989, both hereby incorporated by reference.

While the above methods of MR angiography can provide excellent morphological detail, it is frequently difficult to obtain quantitative flow information. This is because a given volume element, known as a volume pixel ("voxel") may contain a distribution of velocities which interfere with one another in the detection or data collection process.

Several non-angiographic techniques have been proposed though they are not common. For example, the use of flow-encoding gradients which provide a motion-dependent phase shift as described in Feinberg D. A., Crooks L. E., Sheldon P., et al. "Magnetic Resonance Imaging the Velocity Vector Components of Fluid Flow" in Mag. Reson. Med. 2:555 (1985), can be used to quantify flow. Fourier-encoded velocity measurements proposed by Feinberg et al. employ a spin-warp imaging pulse sequence which uses flow sensitive phase-encoding gradient pulses to quantify velocity. A modification of the method of Feinberg was disclosed in inventor U.S. patent application Ser. No. 07/651,872 filed Feb. 7, 1991, "Quantitative Measurement of Blood Flow Using Cylindrically Localized Fourier Velocity Encoding" assigned to the present assignee and hereby incorporated by reference.

Feinberg et al. provide a spatial representation of the velocity of flowing blood, but in only a single dimension. There is a need to provide a non-invasive method of determining the flow of fluids in selected vessels and at multiple locations within the same vessel which is accurate and reliable.

In addition, blood flow measurements are a good indication of hemodynamic properties of a given vessel. These hemodynamic properties are important in medical applications in diagnosing a variety of abnormalities and diseases. It would be useful to acquire the hemodynamic properties without the use of invasive techniques.

SUMMARY OF THE INVENTION

The present invention provides a more selective method of measuring fluid flow through use of MR imaging than heretofore attainable. The method provides for quantitative measurement of fluid flow by applying a homogeneous magnetic field over the subject to be imaged and performing a plurality of magnetic resonance scans, followed by reconstruction of the data to calculate the flow velocities of the fluid. The scan is executed by first applying a comb NMR excitation to the portion of the subject which is to be imaged. Comb NMR excitation of the subject is accomplished by application of a magnetic field gradient accompanied by an rf pulse having a plurality of spaced frequency bands with each band causing excitation of a region of the subject. The rf excitation signal has a large amplitude for frequencies within a frequency band as compared to the amplitude of frequencies between frequency bands. Each frequency band is encoded with a unique phase angle allowing the signals to be separated by region.

Next, a flow encoding magnetic field gradient is applied along the direction in which flow is to be measured. In order to encode velocity of the fluid, the flow encoding magnetic gradient pulse will have two lobes, each lobe having the same area under an amplitude versus duration curve, but having opposite polarities. The scan is repeated many times, with the flow encoding magnetic gradient having a constant predetermined amplitude for each scan, but differing in amplitude for successive scans.

Finally, data is collected by use of an antenna sensing the NMR signal which is re-radiated from the subject and stored for future reconstruction. This rf signal data is stored, and the entire scan is repeated for another amplitude value of the flow-encoded magnetic gradient. Once all the data is acquired, a two dimensional Fourier transform of the scan data is performed to reconstruct the fluid velocity profile. The fluid velocity profile, combined with the cross sectional diameter of a vessel to be imaged, can be used to calculate the fluid flow through the vessel.

OBJECTS OF THE INVENTION

It is an object of the invention to provide an improved method of NMR imaging of fluid flow in living subjects in which an accurate quantitative measurement of the flow can be calculated.

It is another object of the invention to provide a method of NMR imaging of materials having motion while materials having no motion will be suppressed.

It is another object of the invention to provide NMR imaging of nuclei described by second order differentials of motion or higher order differentials of motion, while suppressing images of those nuclei described by lower order differentials of motion.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description taken in conjunction with the accompanying drawings in which:

FIG. 10 is a table of phase shifts used to modulate each slab in a comb excitation.

DETAILED DESCRIPTION OF THE PREFERRED EMBODIMENT

U.S. Pat. Nos. 4,431,968, Edelstein et al., issued Feb. 14, 1984; 4,706,024, Dumoulin, issued Nov. 10, 1987; and 4,796,635, Dumoulin, issued Jan. 10, 1989, all of which are assigned to the present assignee, are hereby incorporated by reference and made part of this disclosure.

Figure 1:
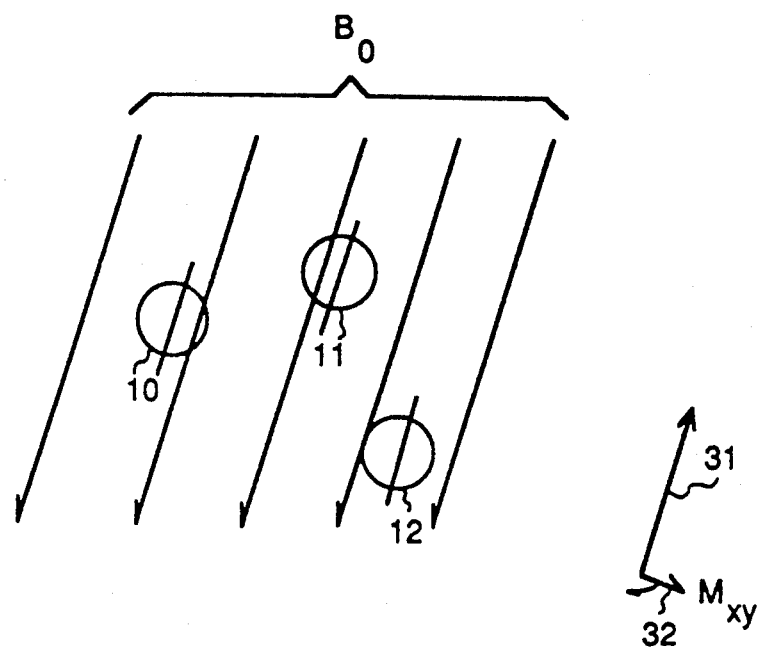
FIG. 1 is a representation of transverse and longitudinal magnetization of spins in a static magnetic field.

Free unpaired spinning protons in the nucleus of a molecule, ("spins"), normally hydrogen nuclei 10, 11 and 12 as shown in FIG. 1, align themselves in a magnetic field $B_0$ such that their axes precess about the magnetic field. Spins 10, 11 and 12 represent a sample of a population of spins. Since there is a population of spins, the macroscopic total of aligned spins causes a net longitudinal magnetization 31 along the magnetic field $B_0$. The net sum of the total population 10, 11 and 12 also results in a small transverse magnetization ($M_{xy}$) 32. The net transverse magnetization 32 can be increased by forcing spins 10, 11 and 12 out of alignment with magnetic field $B_0$ by a force applied by a tuned radio frequency (rf) pulse, or by an external magnetic field. Thus an rf pulse applied in the presence of a magnetic field of predefined strength causes excitation or resonance of the spins, increasing $M_{xy}$ of the spins as represented by spins 14, 15, and 16 of FIG. 2.

Figure 2:
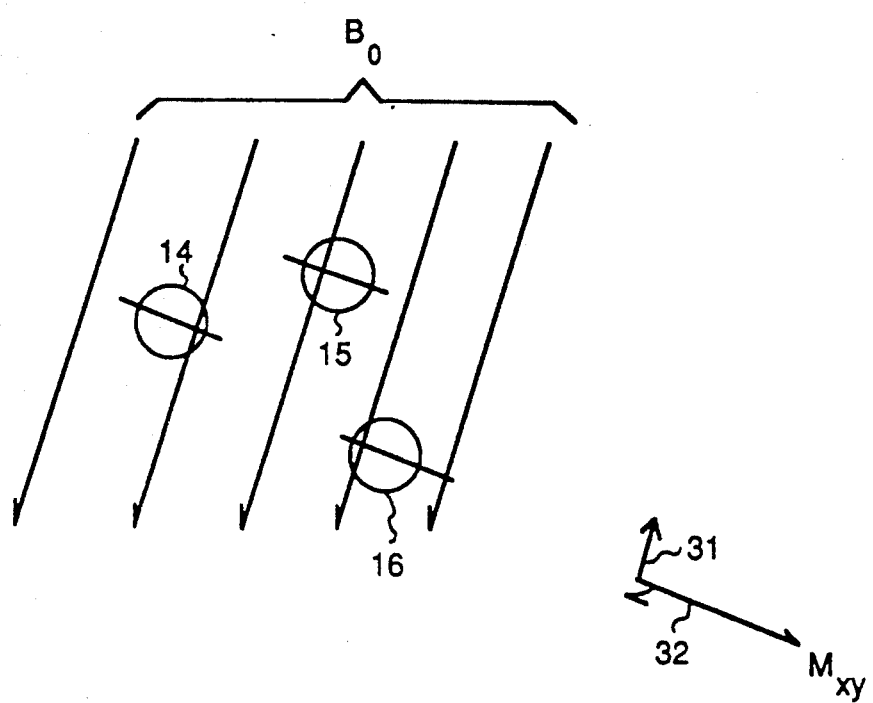
FIG. 2 is a representation of the spins of FIG. 1 after application of an NMR excitation pulse.
Figure 3:
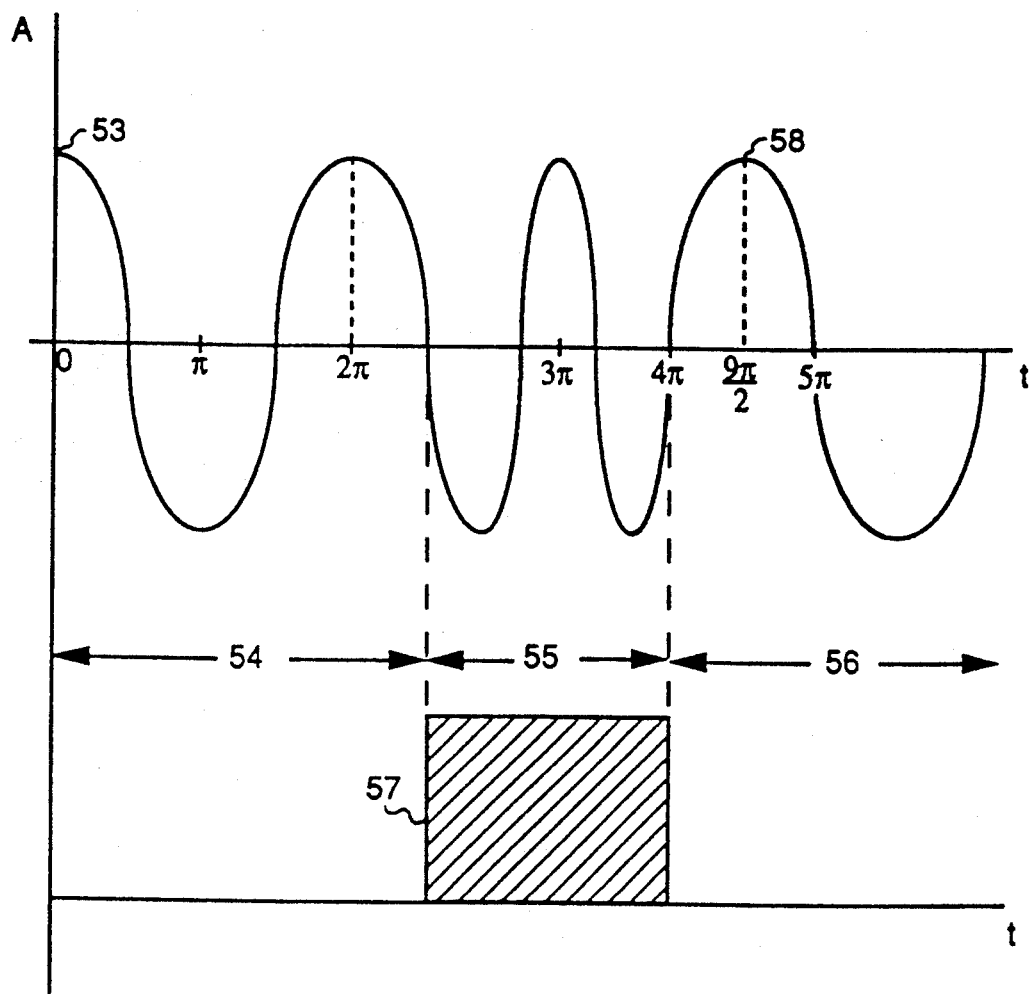
FIG. 3 is a graph of amplitude of a single component of the transverse magnetization vector versus time, upon application of a magnetic field gradient pulse.

FIG. 3 is an amplitude vs. time diagram of a single component of the transverse magnetization vector 32 of FIG. 2 as it rotates at a given location in the sample. The vector rotates at a specific constant frequency during period 54. Magnetic field gradient pulse 57 is applied during period 55, increasing the frequency or rate of change in phase of transverse magnetization 32 depending upon the amplitude of gradient pulse 57. During period 56 of FIG. 3, the transverse magnetization reverts back to its original frequency, but the phase is increased, in this case, by 90 degrees. This is called phase evolution. It must be noted that if the polarity of gradient pulse 57 is reversed, it would cause a reverse effect on the phase shift, retarding the phase by 90 degrees.

The linear phase evolution of each spin 14, 15, 16 of FIG. 2 is directly related to the position of the spin along the magnetic field gradient, the amplitude of the gradient applied to it, and the time during which it is applied (or the area under the gradient pulse lobe 57). The phase shift of stationary spin is directly proportional to the lobe area 57.

Figure 4:
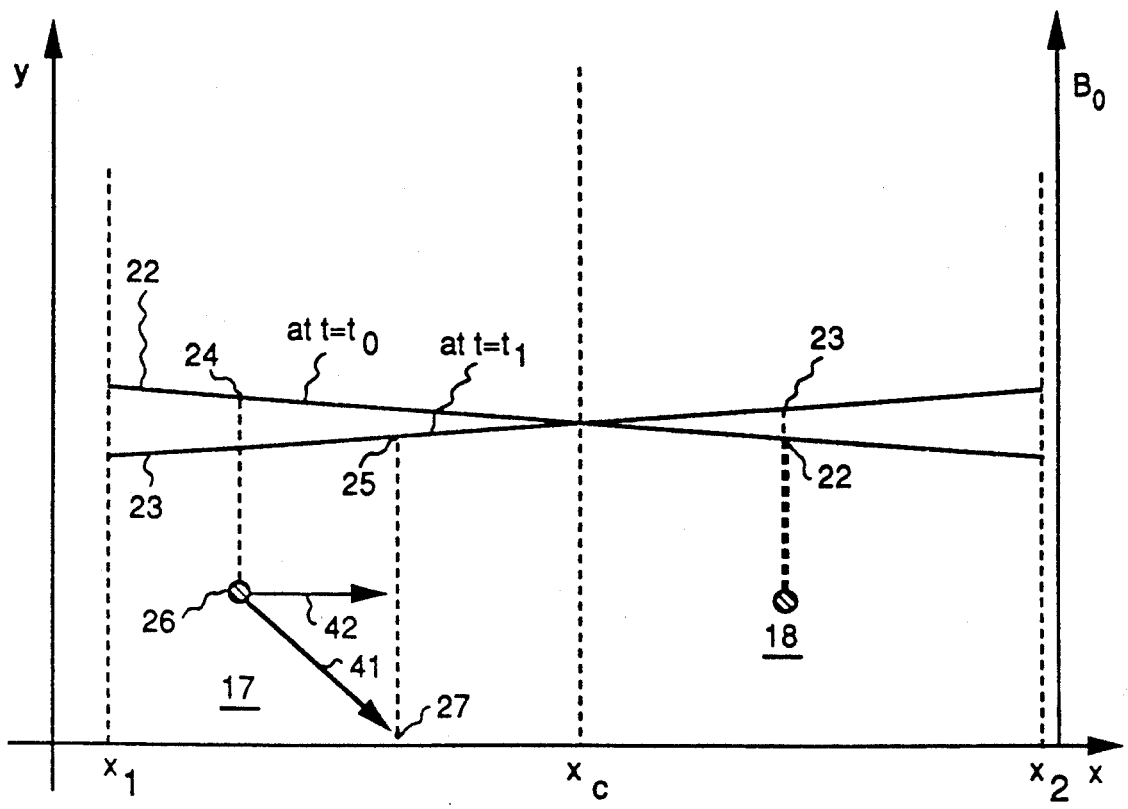
FIG. 4 is a graphical representation of the effect of two oppositely polarized magnetic gradients on spins.

FIG. 4 shows a spin 17 located at point 26 moving at a velocity 41 towards point 27. When spin 17 is at point 26 at time $t=t_0$, a negative magnetic gradient 22 is applied along spatial dimension x. When spin 17 is at point 27 at time $t=t_1$, a positive gradient 23 is applied. This positive gradient 23 is maintained for a period of time substantially identical to the period that the negative gradient 22 was maintained. Over the entire period in which both gradients 22 and 23 are applied, spin 17 experiences phase evolution which arises from gradient 22 and gradient 23. The phase shift induced by gradient 23 is substantially opposite to that induced by gradient 22 because the gradient amplitude polarities 24 and 25 are substantially opposite, but are not exactly opposite due to the physical displacement of spin 17. The resultant phase shift arising from the application of the bipolar gradient comprised of gradients 22 and 23 is directly proportional to the velocity of spin 17. A spin moving in the opposite direction between points 27 and 26 will experience phase evolution which is exactly opposite that of spin 17.

A spin which is not moving in a direction along the gradient 22 or 23, such as spin 18, will first experience a negative gradient 22 at time $t=t_0$, followed by a positive gradient 23 at time $t=t_1$ of equal magnitude. Phase evolution from the positive and negative gradients thereby cancelling each other out. FIG. 4 thus illustrates that the velocity of the spin 17 moving along a magnetic field having a spatial gradient 22 applied at time $t=t_0$ and a second spatial gradient 23 opposite to the first applied at time $t=t_1$, can be used to encode velocity of a spin by its phase evolution. FIG. 4 also shows that a spin 18 which does not have a velocity along the direction of a spatially applied gradient will experience no additional phase evolution due to the cancelling effects of the magnetic field gradients.

Figure 5:
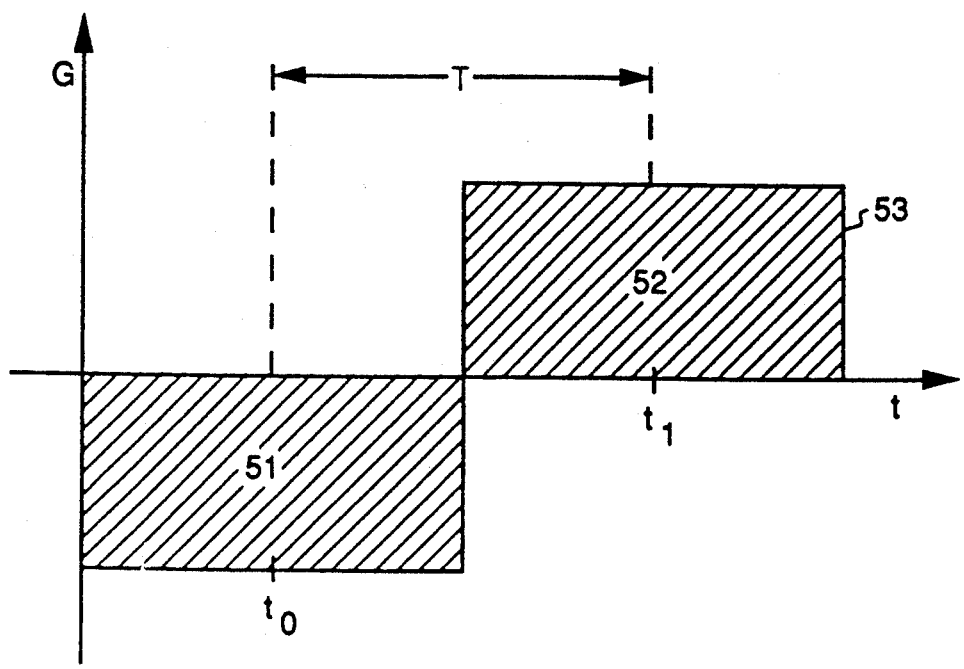
FIG. 5 is a graphical representation of amplitude versus duration of a flow encoding magnetic gradient pulse which may be used by the present invention for velocity encoding.

The phase shift induced by motion of transverse spin magnetization in the presence of a bipolar magnetic field gradient, $\phi_{(motion)}$, can be described as:

$$\phi_{(motion)} = \gamma VTAg \quad [1]$$

where $\gamma$ is the gyromagnetic ratio specific to a given element, and V is the component 42 of the spin's velocity 41 parallel to the direction of the gradient pulse, as shown in FIG. 4. T is shown in FIG. 5 as the time between the centers of the lobes of the magnetic gradient pulse 53 applied along the line in which flow is to be measured, and Ag is the area 51, 52 (gradient strength × duration of application) of one lobe of the bipolar pulse. Equation [1] ignores phase shifts which can arise from higher orders of motion such as acceleration and third order differential of distance known as jerk.

Figure 6:
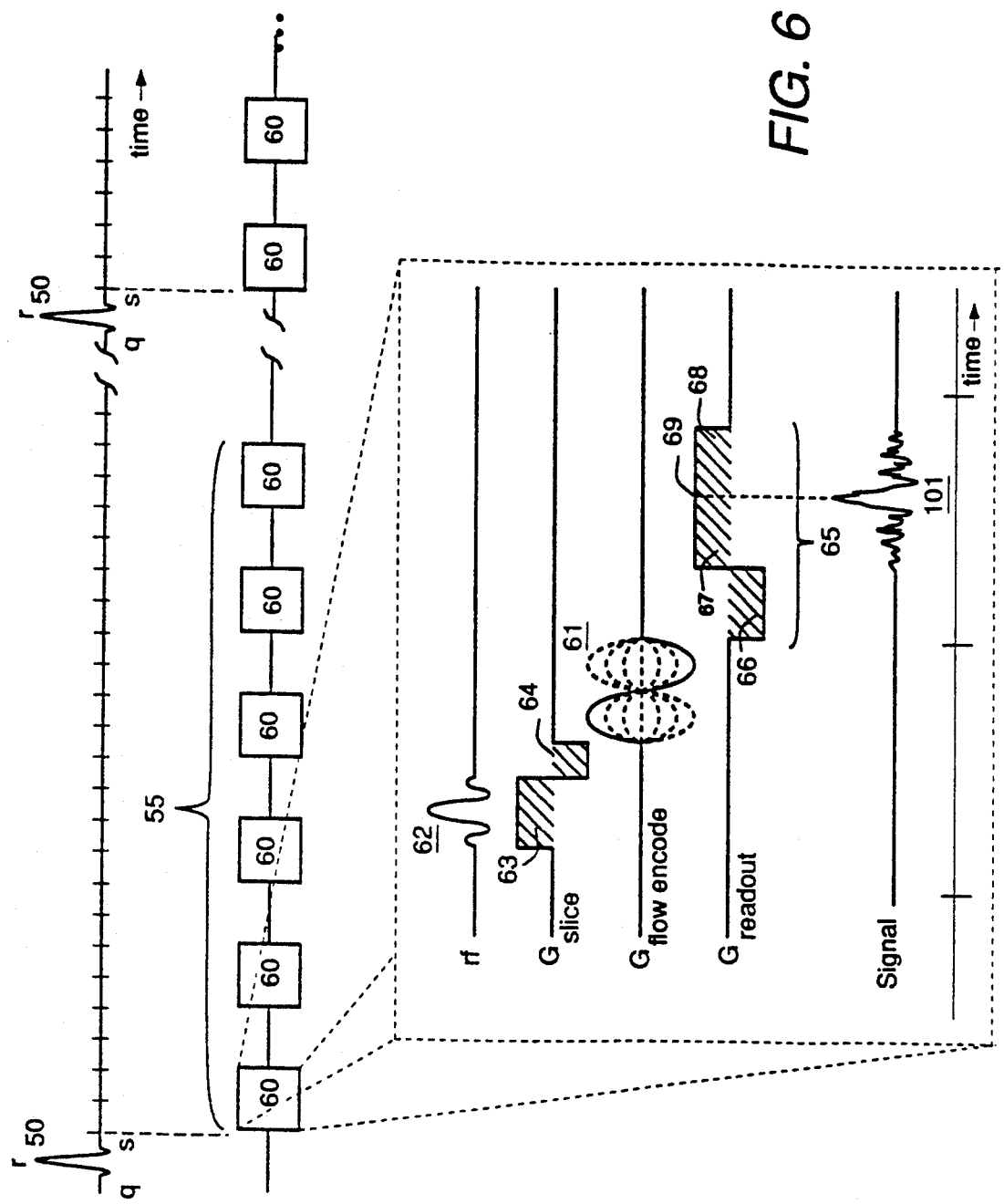
FIG. 6 is a time vs. amplitude diagram of the pulse sequence employed by the present invention for the quantitative measurement of fluid flow using a comb NMR excitation pulse.

FIG. 6 is a representation of a pulse sequence used in driving the rf coils and the magnetic gradient coils of a magnetic resonance imaging system. The sequence of this embodiment has a number of major frames 55, each major frame 55 having a number of subsidiary frames 60 spaced by a time interval, TR. This sequence employs predetermined strengths of the rf pulse and magnetic field gradients to create images of fluid flow.

Spatial localization of spins can be performed by choosing the rf pulse and magnetic field gradients to excite spins of a specific desired area of the subject to be imaged.

Figure 7:
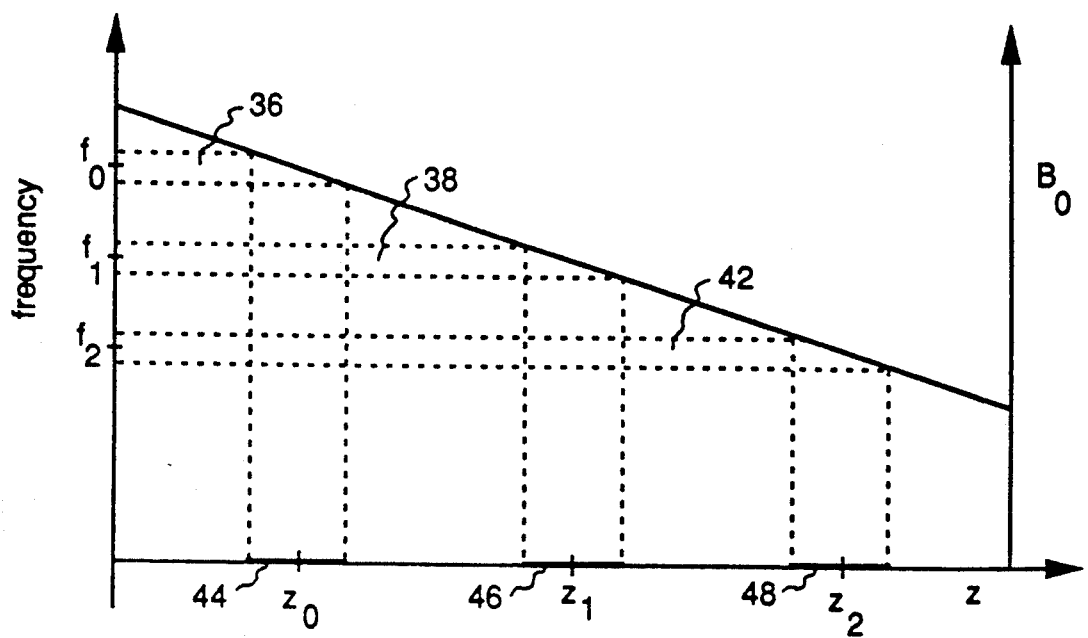
FIG. 7 is a graphical illustration of the relation between a spatially applied magnetic field gradient and corresponding resonant frequencies.

FIG. 7 shows a magnetic field gradient which changes linearly with a spatial dimension z. Nuclei in a material (spins) subject to the magnetic field gradient precess at a frequency which is related to the applied magnetic field ($B_0$). Spins located at position $z_0$ precess at a set frequency of $f_0$, spins at $z_1$ precess at frequency $f_1$, and spins at $z_2$ precess at frequency $f_2$. If an rf stimulus having a frequency which is the same as its frequency of precession is applied to the spins, they will resonate at that frequency and gain additional energy. An rf stimulus can be chosen to selectively cause spins in specific regions to resonate.

Figure 8:
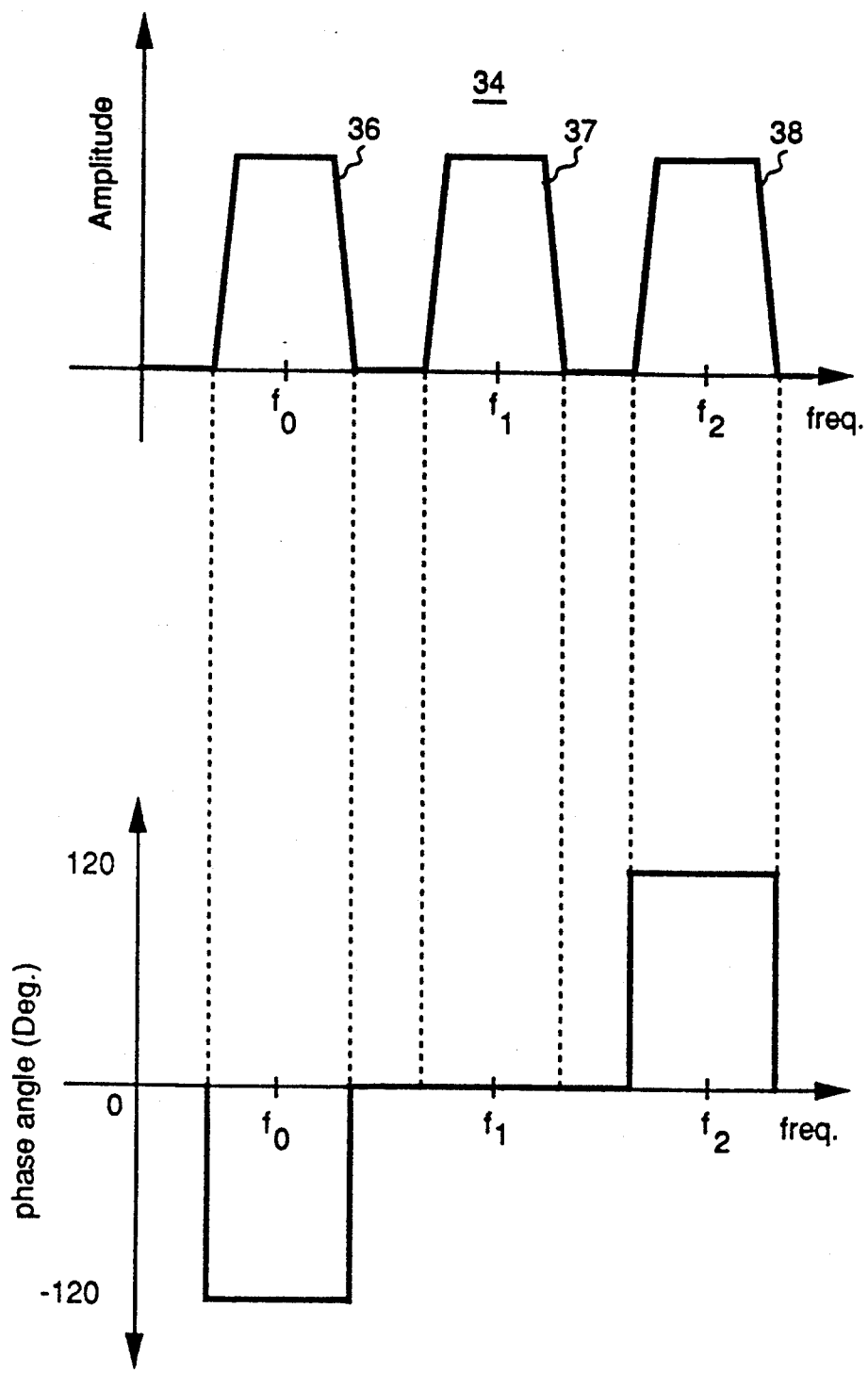
FIG. 8 is a graphical representation of the frequency spectrum of an rf stimulus and its corresponding phase offset.
Figure 9:
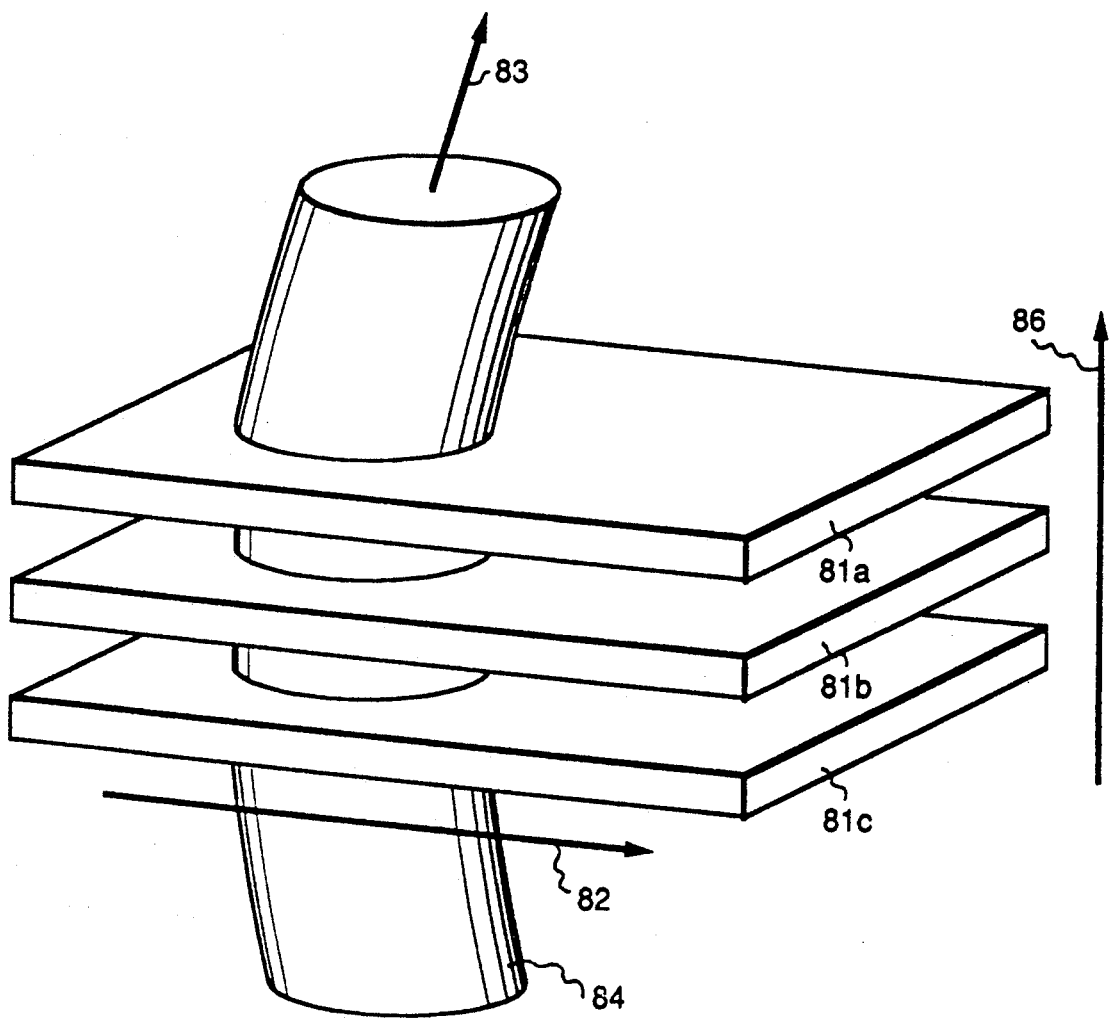
FIG. 9 is a diagram showing the relative geometry of the area of comb excitation for three excitation slabs, the flow encoding gradient, flow sensitivity, and the readout gradient for the present invention.

In FIG. 8 a spectrum 34 of an rf stimulus is shown. The rf stimulus 34 has three frequency bands having a substantial amplitude as compared to the amplitude of the rf stimulus between the bands. The frequency bands are centered at frequencies $f_0$, $f_1$ and $f_2$. By applying rf stimulus to spins in a magnetic field gradient, as shown in FIG. 7, frequency band 36 causes a region 44 to resonate. Region 44 is centered around position $z_0$ and has a width which is proportional to the bandwidth of applied frequency band 36. Similarly, frequency band 38 causes a region 46, which is centered at position $z_1$, to resonate. Frequency band 42 causes resonance of the region 48. Due to the geometry of the magnetic field gradient and the frequency spectrum 34 of the rf stimulus, the resonance of the subject can be localized to three geometrical "slabs" of the subject 81a, 81b, and 81c as shown in FIG. 9. Each frequency band as shown in FIG. 8 has a substantially rectangular shape that converts in the time domain into a (sin x/x), or sinc shape. Rf pulse 62 of FIG. 6 represents only a single frequency band for clarity. The actual shape of rf stimulus 62, having three frequency bands results in the complex wave which is the superposition of three modulated sinc pulses each pertaining to one frequency band.

It should be obvious to those skilled in the art that comb modulation can be applied to other rf and gradient waveforms to give simultaneous excitation of alternatively shaped excitation profiles such as cylinders, spheres and the like.

The rf pulse of FIG. 8 is modulated by three frequencies to cause three slabs to be excited. The modulation of the rf pulse can be performed with a Hadamard encoding scheme as reported by Souza SP, Szumowski J, Dumoulin CL et al., "SIMA: Simultaneous Multislice Acquisition of MR Images by Hadamard-Encoded Excitation", in J. Comp. Asst. Tomogr. 12:1026, (1988), or it can be performed in a more general fashion as reported by Glover GH, "Phase-Offset Multiplanar (POMP) Volume Imaging: A New Technique", in J. Magn. Reson. Imag. 1:457, (1991).

As shown in FIG. 9, three geometrical slabs 81a, 81b, 81c are excited and localized. Since the signals from resonating spins will be superimposed upon each other, a means of separating signals from each slab is needed. The present invention employs phase encoding. The rf stimulus shown in FIG. 8 has three bands which must be encoded. The first band 36 centered at $f_0$ has a $-120$ Deg. phase offset. The second band 37 centered at $f_1$ is given a 0 Deg. phase offset. And the third band 38 centered at $f_2$ is given a 120 Deg. phase offset. The selected phase shift increment is unique for each slab, and does not change during the procedure. The choice of phase shift increment determines the displacement of signal intensity in the phase encoding dimension from each slab. When the signals are collected, it is possible to determine from which slab the signals originated. A sample set of phase shift increments (expressed in degrees) for comb excitation rf pulses having eleven slabs numbered from one to eleven is shown in FIG. 10.

After the spins have been excited, the spin dephasing caused by the second half of the selection gradient pulse 63 of FIG. 6 is refocused by the application of a gradient pulse 64. Gradient pulse 64 has equal area but opposite polarity to the second half of the selection gradient 63.

After the slabs are excited with the rf pulse, they are velocity encoded. The present invention utilizes Fourier velocity encoding with a pulse sequence 61 shown in FIG. 6.

Referring again to FIG. 9, in order to encode fluid flow as represented by a vector 83, the present invention employs a flow encoding magnetic field gradient applied along a direction in which flow is intended to be measured, and represented by a vector 86. This causes phase evolution of the spins to occur with the higher velocity spins evolving faster than the lower velocity spins. Using equation [1], the velocity 42 of a sample of spins 17 and 18 of FIG. 4, can be quantitatively measured if the phase shift can be determined. Unfortunately, MR signals from a spatial region come from an ensemble of spins; and if these spins are moving, their velocity is characterized by a distribution rather than a single velocity. This distribution can be broad enough to cause the phase of the component spin signals to cancel and thus result in loss of signal.

One way to overcome the problem of spin velocities interfering with each other upon data acquisition is to convert one spatial dimension of a conventional image into a velocity dimension. This adds a dimension in which the velocity data (and its distribution) can be measured.

The present invention exploits the properties of the Fourier Transform to separate the constituent velocities on reconstruction and prevent signal loss. This is done by, for example, using a series of excitations to apply successively larger flow encoding gradients 51, 52 of FIG. 5, 61 of FIG. 6 or larger separations T, as shown in FIG. 5, and sampling the re-radiated data. This allows data to be collected for a number of flow encoding gradient amplitudes. Fourier transformation is then used to separate the various velocity constituents by virtue of their modulation frequencies to produce a data vector which presents signal intensity as a function of velocity. It will be noted that the bipolar flow-encoded gradient waveform 61 of FIG. 6 is one of a series of waveforms each having a different amplitude.

The present invention bears some similarity to the Fourier-encoded velocity measurements proposed by Feinberg et al., supra; however, the pulse sequences utilized by the present invention differ from the pulse sequences of Feinberg et al. Comb field excitation and independent flow encoding geometry are not employed by Feinberg et al.

Data is acquired by applying a readout magnetic field gradient 65 as shown in FIG. 6 and represented by vector 82 of FIG. 9 in the plane of the excited slabs. The spins 17, 18, represented in FIG. 4, re-radiate photons when in the excited state and placed in a magnetic field gradient such as the readout gradient 65 as represented by vector 82 of FIG. 9. Each readout gradient pulse 65 has two lobes as shown in FIG. 6. The first lobe has an area 66 equal to the first half 67 of the second lobe. The readout gradient causes a negative phase evolution during application of the first lobe 66 followed by a positive phase evolution during application of the first half 67 of the second lobe, causing a rephasing at midpoint 69 of second lobe 68. The peak of the signal echo 101 occurs at this point in time. This echo is a gradient recalled echo. Signal 101 is sensed and stored for each frame.

The resulting data set has a single spatial dimension (i.e. the readout dimension) and one velocity dimension which is sensitive only to the component of velocity which is parallel to the applied flow encoding magnetic field gradient pulse 61 of FIG. 6.

With respect to FIG. 9, the relative orientations of the flow encoding gradient 86, readout gradient 82 and excitation slabs 81a, 81b and 81c, are not constrained and can be mutually orthogonal, parallel or oblique.

The velocity resolution of the resulting flow measurement can be calculated by using the Nyquist criterion with equation [1]. The Nyquist criterion specifies that phase difference between adjacent samplings of a signal must be less than if the signal is not aliased. Consequently, the maximum phase shift which is obtained for the highest non-aliased velocity is:

$$\phi_{(max)} = \pi V_{res}/2 \qquad [2]$$

where $V_{res}$ is the number of velocity encoded samples in a procedure in which the area of one lobe of the flow encoding lobe 61, shown in FIG. 6, is varied from $Ag_{(-max)}$ to $-Ag_{(max)}$. The velocity resolution, $V_{res}$, (cm/s/pixel) can then be determined by combining equations [1] and [2] to give:

$$V_{res} = \frac{1}{2\gamma T A g_{(max)}} \qquad [3]$$

The pulse sequence illustrated in FIG. 6 is very flexible and can be applied in a variety of manner. Since the orientations of the readout gradient 82, flow encoding gradient 86 and excitation slabs, as shown in FIG. 9, are independent of one another, it is possible to optimize the pulse sequence for different vascular anatomies and applications, although in general it may be most advantageous to align the vessel of interest 84 to be perpendicular to the excited slabs 81a, 81b and 81c. For example, the geometry shown in FIG. 9 can be modified such that the flow-encoding gradients are applied in three orthogonal directions in three successive acquisitions. This triples the required scan time but permits the quantification of blood flow without prior knowledge of the vessel geometry.

Since most of the blood flow in the body of most living subjects is pulsatile, it is frequently useful to repeat the pulse sequence for several time frames after the detection of an r-wave of a cardiac cycle to provide a temporal dimension for the data.

Synchronization of acquisition with the cardiac cycle is essential if the temporal characteristics of blood flow are to be measured. Velocity measurements performed with cardiac gating are made synchronously over a large number of cardiac cycles and permit the differentiation of constant and periodic flow. Under these conditions, both periodic and constant flow behavior are easily measured and the velocity distribution is well characterized (i.e. there is little signal intensity at unexpected velocities).

FIG. 6 is an amplitude vs. time diagram of the preferred embodiment of the present invention with which the subject's cardiac cycle is monitored. Monitoring equipment such as an electrocardiograph apparatus is used to detect electrical impulses of the cardiac cycle. Wave 50 is a typical qrs complex sensed by monitoring equipment. Upon the detection of a qrs complex 50, several frames 60 of data are collected. Data collected in each frame is collected responsive to rf and gradient pulses as shown in FIG. 6.

Figure 11:
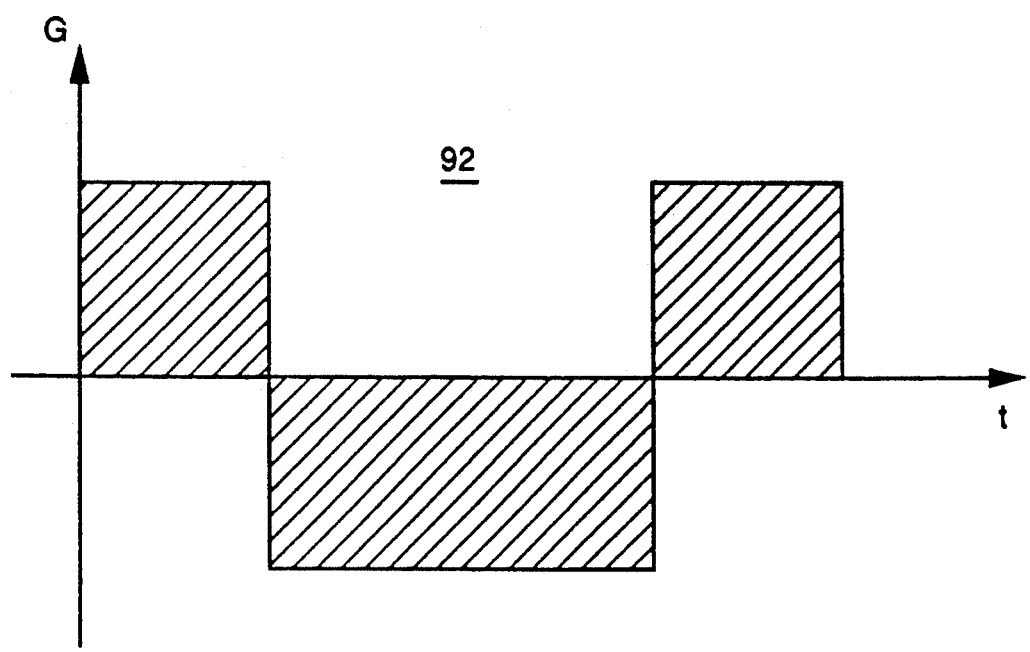
FIG. 11 is a graphical representation of amplitude versus duration of a flow encoding magnetic gradient pulse which may be used by the present invention for acceleration encoding.

Another variation of the sequence that may be employed in the present invention is the conversion of the bipolar flow-encoding pulse into a three-lobed acceleration encoding pulse 92 as shown in FIG. 11 or a three-lobed acceleration compensated/velocity encoding pulse. For a discussion thereof, see Dumoulin C. L., Souza S. P., Walker M. F. and Yoshitome E. "Time-resolved Magnetic Resonance Angiography", Mag. Reson. Med. 6:275, (1988) hereby incorporated by reference and made part of this disclosure. The application of Fourier acceleration encoding to in-vivo systems, however, is limited by the strength of the gradient subsystem in currently available instruments, with maximum gradient amplitudes on the order of 1 G/cm. Use of a three-lobed acceleration pulse would result in suppression of any differential orders of motion below the second differential order of motion, which is useful in imaging acceleration of fluids. In other words, non-moving spins and spins moving with constant velocity would be suppressed.

Figure 12:
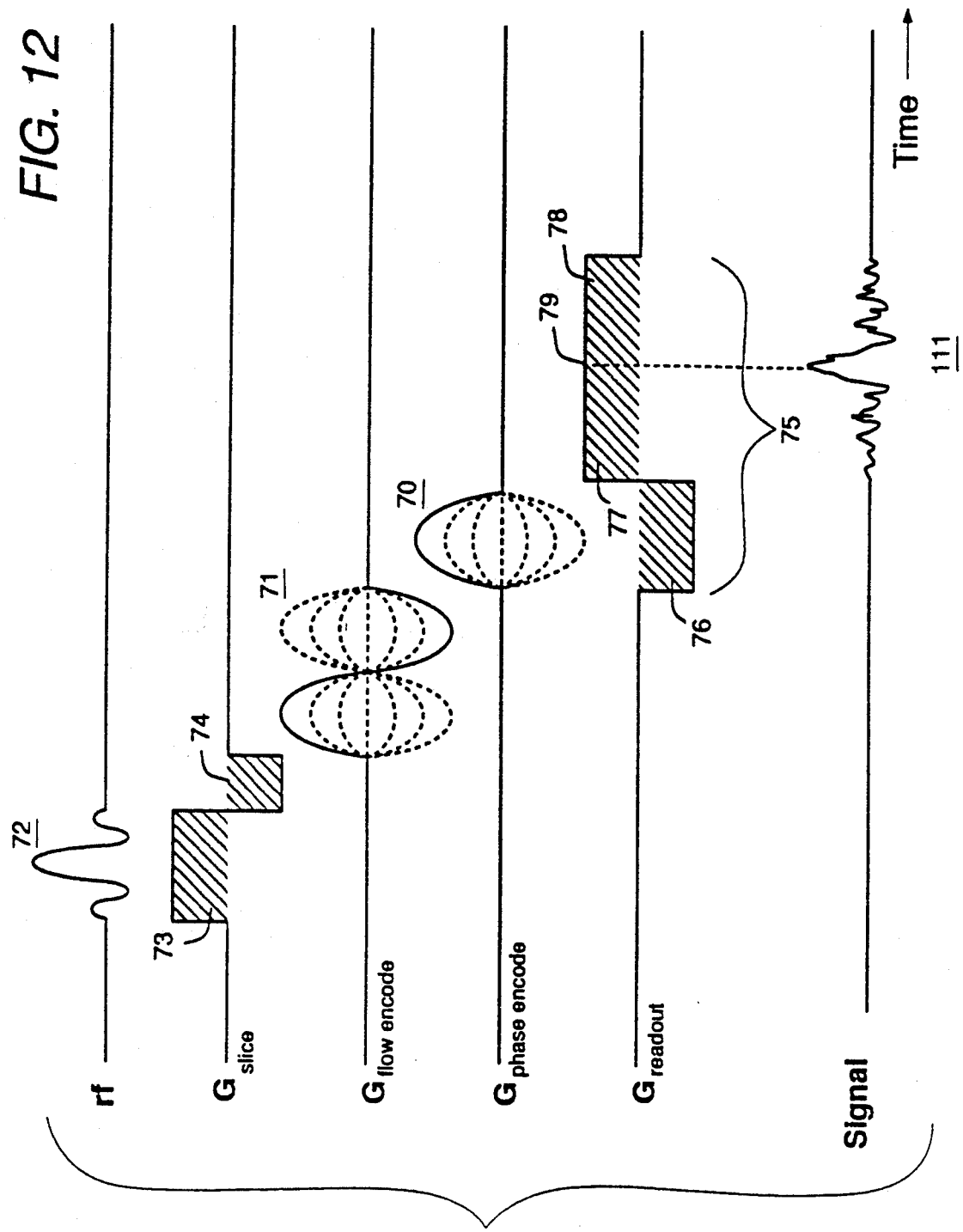
FIG. 12 is a time vs. amplitude diagram of a second embodiment of the pulse sequence of the present invention for the quantitative measurement of fluid flow using a comb NMR excitation pulse.

An alternative embodiment of the invention is illustrated in FIG. 12. In this embodiment cardiac synchronization is not used. In addition, this embodiment employs a spatial phase encoding pulse 70 not found in the previously described embodiment. This phase encoding pulse 70 is incremented independently of the flow encoding pulse 71 so that data is collected for every combination of the spatial and velocity phase encoding gradient intensities. The comb excitation rf pulse 72 and its associated gradient pulses 73 and 74 are substantially identical to those used in the embodiment illustrated in FIG. 6. The flow encoding gradient pulses 71 and the readout gradient pulse 75 are substantially identical to the flow encoding pulse 61 and readout 65 found in FIG. 6. Likewise the areas of the readout gradient pulse 76, 77 and 78 are substantially identical to readout gradient pulses 66, 67 and 68. In this embodiment the signal 111 is collected during a time period substantially centered on the center 79 of the second lobe 78 of the readout gradient 75. The sequence shown in FIG. 12 results in collection of a three dimensional data set which has two spatial dimensions and one velocity dimension.

Flow velocity can be acquired at differing periods in a cardiac cycle using the gating described above. Images can then be reconstructed at each instant during the cardiac cycle. These images may then be displayed in succession to produce a simulated movie of the flow velocity. This is referred to as a "Cine" display.

Several additional embodiments of the invention are possible using techniques well known to those skilled in the art. One embodiment incorporates one or more spatially selective rf pulses applied in selected regions of the subject to cause the magnetization of spins in these regions to become saturated. This substantially prevents contribution of signal from these selected regions. A second embodiment incorporates a 180 degree rf pulse to refocus phase shifts due to resonance offset conditions such as chemical shift effects, magnetic susceptibility effects and the like.

The results of quantitative measurement of blood flow in the femoral artery of a human subject is disclosed below.

Data was acquired on a 1.5 Tesla imaging system with shielded gradient coil subsystem at General Electric Company, Milwaukee, WI. Velocity quantification was performed using the pulse sequence outlined in FIG. 6 above. Gradient pulses were employed close to the power limits of the gradient amplifier subsystem. The rf flip angle was chosen to be 30 degrees and the number of excitation data sets averaged was chosen to be 1. The acquisition matrix was a 256×256 grid. Sixteen velocity samples per cardiac cycle were obtained in a single gated study. The strength of the flow encoding gradient was calculated to provide a velocity resolution of 2.5 cm/s/pixel. The thickness of each slab was 0.5 cm and the center of each slab excitation was separated by 4 cm.

Figure 13A:
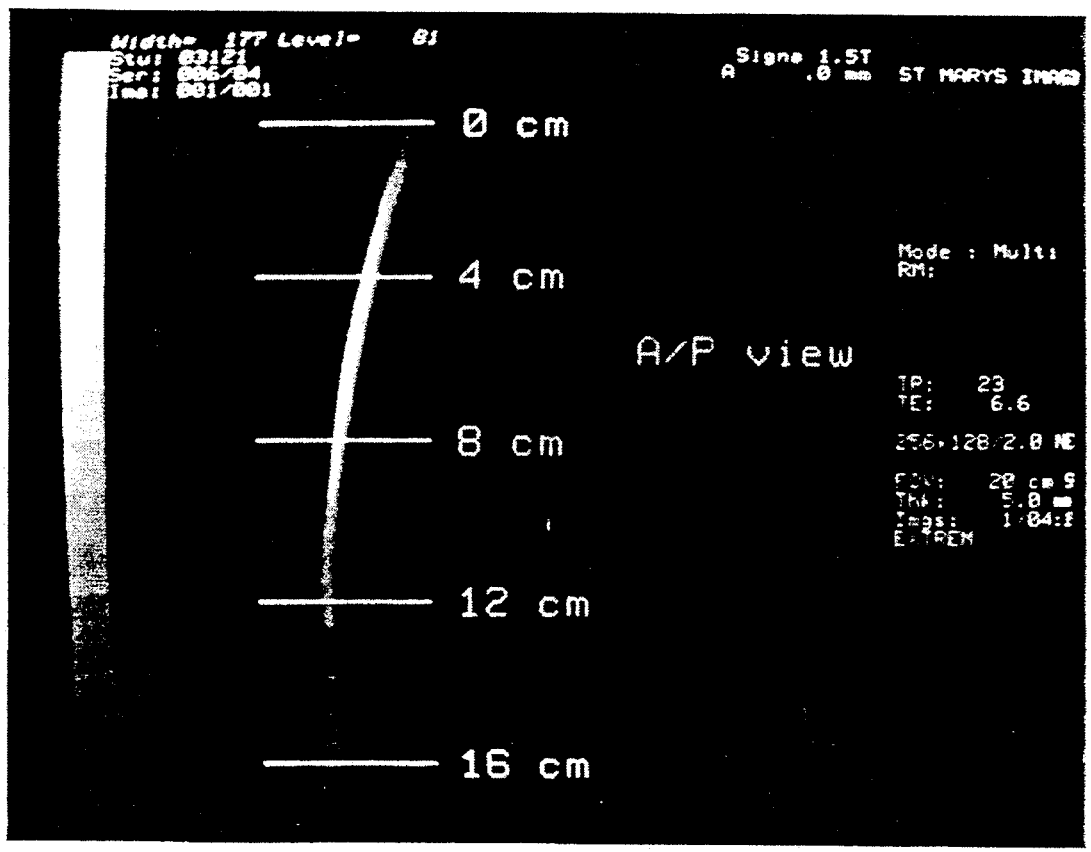
FIG. 13a is a two-dimensional phase-contrast angiogram of an Anterior/Posterior view of a femoral artery of a human subject showing the placement of five excitation slabs.
Figure 13B:
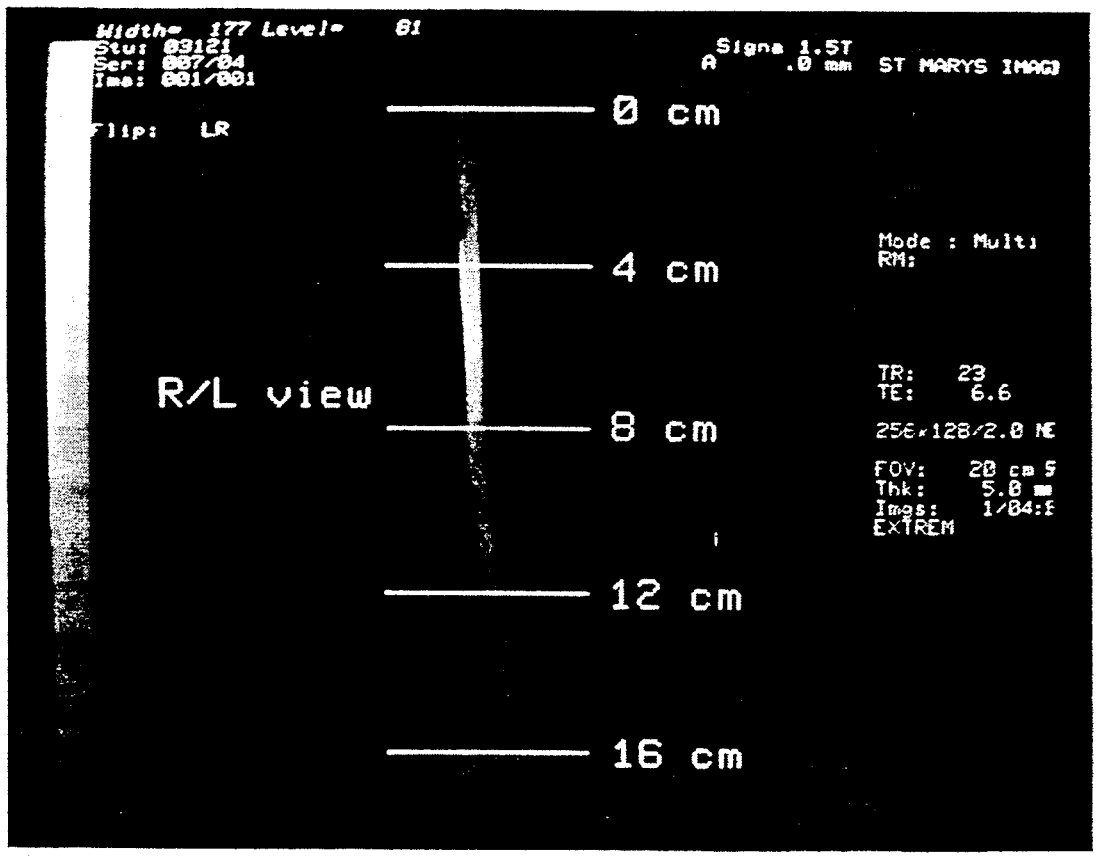
FIG. 13b is a two-dimensional phase-contrast angiogram of a Left/Right view of a femoral artery of a human subject showing the placement of five excitation slabs.

Two-dimensional phase-contrast angiograms were obtained on the right thigh of a healthy volunteer. FIG. 13a shows a projection in the subject's Anterior/Posterior direction, and FIG. 13b shows a projection in the subject's Left/Right direction. The horizontal lines indicate the locations of the comb excitation that was used in the Fourier Velocity Encoded studies described below.

Figure 14:
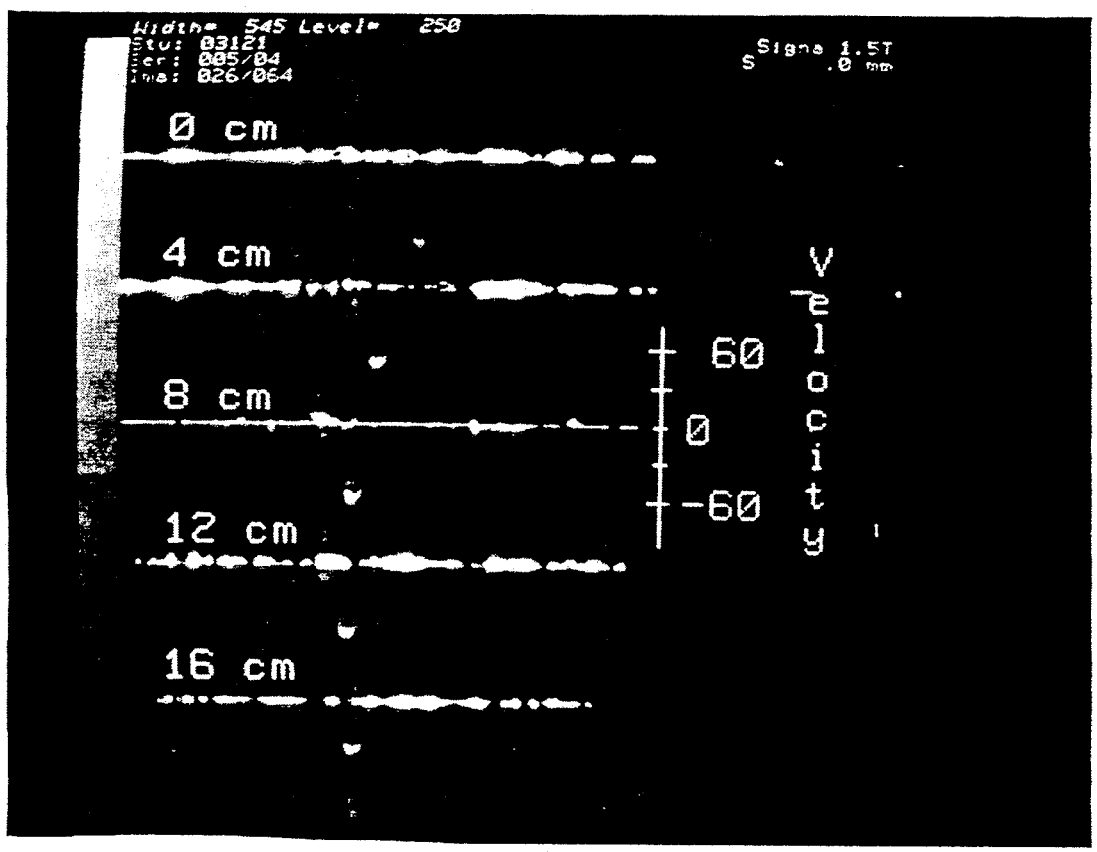
FIG. 14 shows a quantitative velocity image created by the use of the present invention applied to the femoral arteries shown in FIGS. 13a and 13b, in which the horizontal axis is representing spatial displacement in the Right/Left direction and the vertical axis is representing velocity at the five excitation slabs.

FIG. 14 shows one image extracted from the Fourier Velocity Encoded data set having 256 points in the spatial dimension (0.781 mm/pixel), 256 points in the velocity dimension (2.5 cm/sec/pixel) and 64 points in the .emporal dimension (8.31 ms/pixel). The data was acquired in four segments, each lasting approximately four minutes and each obtaining 16 temporal phases of the cardiac cycle. The delay between the detection of the R-wave and the beginning of the pulse sequence was incremented by 8.31 ms (i.e. TR/4 DEFINE) for each segment. The horizontal dimension of the image contains spatial information resolved in the right/left axis of the subject. The vertical dimension of the image contains velocity information for the velocity vector along the subject's superior/inferior axis. Each horizontal line in the image represents the zero velocity data for each of the five slices in the comb excitation.

Figure 15:
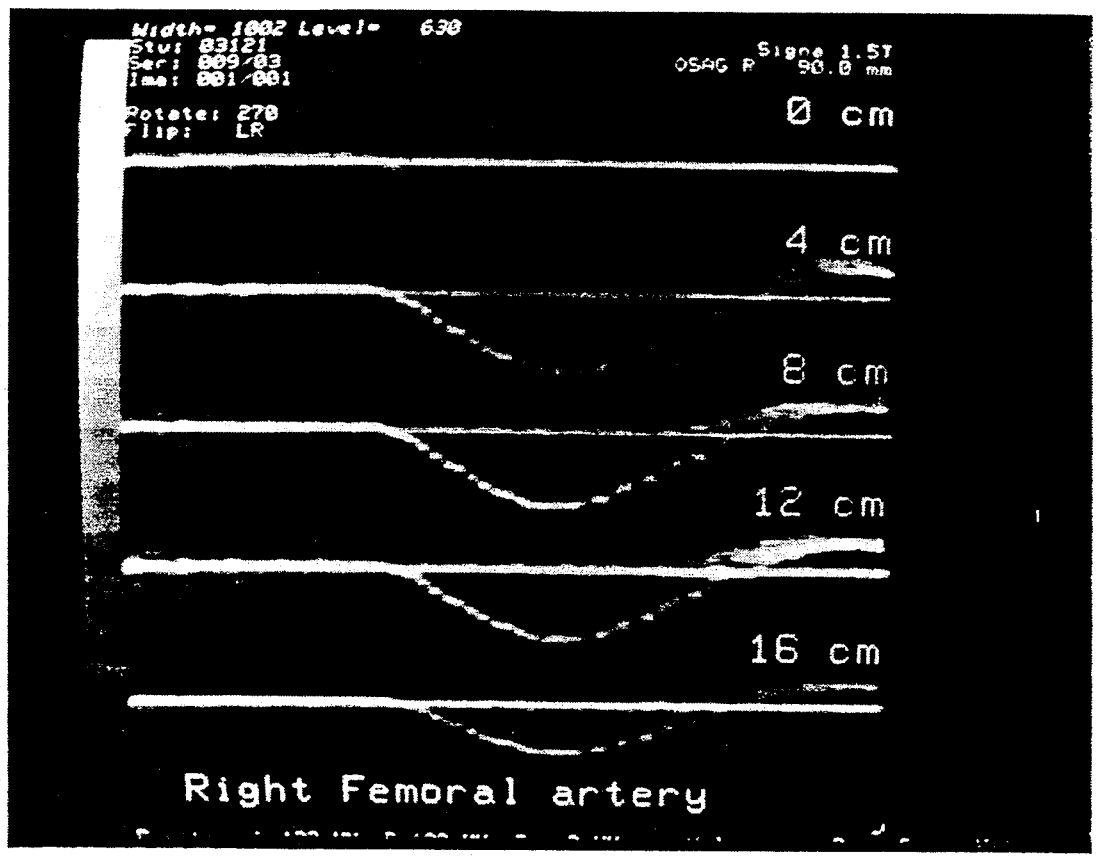
FIG. 15 shows a graph using the same data used in FIG. 14 in which the vertical axis represents velocity and the horizontal axis represents time during the cardiac cycle.

FIG. 14 is a snap-shot of the flow dynamics obtained at 300 ms after detection of the subject's R-wave. Data from the center of the right femoral artery was reformatted so that the velocity vector along the subject's inferior/superior axis was displayed as a function of the cardiac cycle. FIG. 15, contains quantitative velocity information in the vertical dimension with the same resolution as FIG. 14, but now displays the temporal changes in velocity from zero to 532 ms after detection of the R-wave.

Fourier velocity encoded images such as those presented here can be used to measure several hemodynamic properties of blood flow. For example, the maximum velocity within a vessel is easily determined by finding the pixel within the limits of the vessel which has the greatest displacement in the velocity dimension. Since the intensity of each pixel in a velocity image is proportional to the number of spins moving at a given velocity and in a given location, the mean velocity and the width of the velocity distribution can be easily determined. This can be done for each point in the spatially encoded dimension or over the entire vessel. The width of the vessel can be determined in the readout direction; but if its cross section is non-circular or if the readout gradient is applied obliquely, a conventional image may be required for determination of vessel cross-section. Once the cross sectional area is known, the total flow in the vessel can easily be determined.

Therefore, the present invention provides a method of NMR imaging of molecules having motion while suppressing images of molecules having no motion. The present invention can also suppress images of molecules in motion described by first order differentials or images of molecules which are not moving while imaging molecules described by second and higher order differentials of motion.

While only certain preferred features of the invention have been illustrated and described herein, many modifications and changes will occur to those skilled in the art. It is, therefore, to be understood that the appended claims are intended to cover all such modifications and changes as fall within the true spirit of the invention.

What is claimed is:

1. A method for quantitative measurement of fluid motion in a vessel of a subject comprising the steps of:
   a) applying a homogeneous magnetic field over said subject;
   b) performing a plurality of scans of said subject to acquire a set of scan data, each scan comprising the steps of:
      i. applying a comb excitation to a region of said subject to produce a plurality of excited portions,
      ii. flow encoding the excited portions of the subject by applying a flow encoding magnetic gradient pulse along an axis of the flow to be measured, the flow encoding magnetic gradient pulse having a predetermined amplitude varying from a maximum of one polarity for an initial scan to a maximum of opposite polarity for the final scan, and having at least one negative lobe and at least one positive lobe,
      iii. collecting a set of scan data by executing the steps of:
         A. applying to said subject a first readout magnetic field gradient pulse,
         B. applying to said subject a second readout magnetic field gradient pulse having an area under its amplitude vs. time curve greater than or equal to that of the first readout gradient field pulse but of opposite polarity, C. sensing an amount of MR signal re-radiated by the excited portion of said subject over a given period in the presence of the magnetic readout gradient field pulses, and D. storing a set of scan data related to the MR signal re-radiated by the subject pertaining to the corresponding predetermined amplitude of the flow encoding magnetic gradient pulse; and c) reconstructing the scan data to determine said fluid velocity by two-dimensionally Fourier transforming the scan data to reconstruct a fluid motion profile.

2. A method for quantitative measurement of fluid motion in a subject as recited in claim 1 wherein the step of applying a comb excitation comprises the steps of:

a) applying a magnetic field gradient to said subject;

b) applying an rf excitation pulse having a plurality of spaced frequency bands with each respective frequency band causing excitation in a corresponding respective portion of said subject, the rf excitation pulse having a large amplitude for frequencies within any one of said frequency bands as compared to the amplitude of frequencies between frequency bands, the rf excitation pulse having a total amplitude and duration such as to cause magnetic resonance of nuclei in the multiple excited portions of said subject, the rf excitation pulse having a unique phase angle for each respective frequency band.

3. A method for quantitative measurement of fluid motion in a subject as recited in claim 1 wherein the flow encoding magnetic gradient pulse has only two lobes, the first flow encoding magnetic gradient pulse lobe having a predetermined amplitude varying from a maximum one one polarity for an initial scan to a maximum of opposite polarity for the final scan, and the second flow encoding magnetic gradient pulse lobe having opposite amplitude and the same area under its amplitude vs. duration curve as the first flow encoding magnetic gradient pulse lobe, the flow encoding magnetic gradient pulse causing encoding of said fluid having motion described by first and higher order differentials in the excited portions of the subject.

4. A method for quantitative measurement of fluid motion in a subject as recited in claim 3 wherein the plurality of scans are timed to correspond to a specific point of a cardiac cycle of a living subject in order to create an instantaneous fluid velocity profile.

5. A method for quantitative measurement of fluid motion in a subject as recited in claim 4 including the step of reconstructing, from a set of scan data collected from said scans, instantaneous velocity images corresponding to a specific portion of the cardiac cycle.

6. A method for quantitative measurement of fluid motion in a subject as recited in claim 5 further comprising the step of displaying the instantaneous velocity images in sequence to create a motion picture of the velocity images.

7. A method for quantitative measurement of fluid motion in a subject as recited in claim 2 further comprising the step of determining a location in said subject to be measured with use of conventional Magnetic Resonance Imaging techniques, then confining the comb excitation to said location to obtain an improved measurement.

8. A method for quantitative measurement of fluid motion in a subject as recited in claim 2 wherein the flow encoding magnetic gradient pulse has three lobes such that the area under a time vs. amplitude curve of the first lobe and third lobes is equal to the area under a time vs. amplitude curve of the second lobe, and the area under an amplitude vs. duration curve of the second lobe is the negative of the total area under an amplitude vs. duration curve of the first and third lobes, so as to encode fluid flow in the excited portions of said subject having motion along the direction of the flow encoding magnetic gradient pulse, the motion of said fluid being described by second and higher order differentials of velocity with respect to time.

9. A method for quantitative measurement of fluid motion in a subject as recited in claim 2 further comprising, after comb excitation, and before collecting the scan data step of applying an rf pulse of a predetermined amplitude to the excited portions to cause a 180 degree flip angle of spins relative to their spin positions before application of the rf pulse in order to cancel errors incurred by magnetic field in homogeneity.

10. A method for quantitative measurement of fluid motion in a subject as recited in claim 2 further comprising the step of applying an rf pulse of a predetermined amplitude and a magnetic gradient pulse of a predetermined amplitude and predetermined direction to a selected region to cause longitudinal magnetization of spins in the region to become saturated and thereby not contribute to the observed MR signal.

11. A method for quantitative measurement of fluid motion in a subject as recited in claim 2 further comprising the steps of: applying a second magnetic field gradient pulse in a second direction orthogonal to said predetermined direction, and applying a corresponding rf pulse chosen to cause a plurality of elongated volumes of the subject to become excited.

12. A method for quantitative measurement of fluid motion in a subject as recited in claim 11 further comprising the steps of: applying a third magnetic field gradient pulse in a direction mutually orthogonal to said predetermined and second direction, and supplying a corresponding rf pulse chosen to cause a plurality of volumes of the subject, each having an arbitrary shape in three-dimensions, to become excited.

13. The method for quantitative measurement of fluid motion in a subject as recited in claim 1 wherein said magnetic field gradient pulse is single lobed and of predetermined amplitude varying from a maximum amplitude in a selected scan to an oppositely maximum amplitude for a different selected scan, so as to cause positional information of said fluid to be encoded in received signal phases in addition to said fluid motion.

14. The method for quantitative measurement of fluid motion in a subject as recited in claim 1 further comprising the steps of determining a cross sectional diameter of said vessel from the scan data, and calculating said fluid flow from said vessel cross sectional diameter and the fluid motion profile.

* * * * *